United States Patent [19]

Chi

[11] Patent Number: 5,330,930

[45] Date of Patent: Jul. 19, 1994

[54] FORMATION OF VERTICAL POLYSILICON RESISTOR HAVING A NITRIDE SIDEWALL FOR SMALL STATIC RAM CELL

[75] Inventor: Keh-Fei C. Chi, Singapore, Singapore

[73] Assignee: Chartered Semiconductor Manufacturing Pte Ltd., Singapore, Singapore

[21] Appl. No.: 999,745

[22] Filed: Dec. 31, 1992

[51] Int. Cl.⁵ .................... H01L 21/70; H01L 27/00
[52] U.S. Cl. ......................................... 437/60; 437/47; 437/918
[58] Field of Search ................ 437/47, 52, 60, 918, 437/200, 193; 257/350, 359, 379, 380, 382, 538, 904

[56] References Cited

U.S. PATENT DOCUMENTS

| | | | |
|---|---|---|---|
| 4,727,045 | 2/1988 | Cheung et al. | 437/47 |
| 4,797,717 | 1/1989 | Ishibashi et al. | 257/904 |
| 5,013,677 | 5/1991 | Hozumi | 437/47 |
| 5,086,017 | 2/1992 | Lu | 437/200 |
| 5,170,233 | 12/1992 | Liu et al. | 437/60 |
| 5,177,030 | 1/1993 | Lee et al. | 437/47 |
| 5,229,311 | 7/1993 | Lai et al. | 437/43 |

Primary Examiner—Olik Chaudhuri
Assistant Examiner—H. Jey Tsai
Attorney, Agent, or Firm—George O. Saile

[57] ABSTRACT

A new method of forming a polysilicon resistor is achieved. Polysilicon gate structures and source/drain regions are formed in and on a semiconductor substrate. A passivation layer is formed overlying the gate structures. A contact window is opened to the drain portion of the source/drain region. A resistor is formed within the contact window as follows. A nitride layer is deposited over the passivation layer and within the contact window. The nitride layer is etched back to form nitride sidewalls within the contact window. A layer of polysilicon is deposited over the passivation layer and within the contact window. The polysilicon layer is etched back to leave the polysilicon only within the contact opening completing formation of the resistor. A second contact window is opened to the source portion of the source/drain region. A barrier metal layer is deposited over the passivation layer, over the resistor, and within the second contact window. A metal layer is deposited over the barrier metal layer and the metal interconnection of the integrated circuit is completed.

18 Claims, 3 Drawing Sheets

FORMATION OF VERTICAL POLYSILICON RESISTOR HAVING A NITRIDE SIDEWALL FOR SMALL STATIC RAM CELL

BACKGROUND OF THE INVENTION (1) Field of the Invention

This invention relates to the fabrication of integrated circuit devices and more particularly to a method of forming a polysilicon resistor within a contact window.

(2) Description of the Prior Art

The conventional four-transistor static random access memory (SRAM) cell uses a horizontal polysilicon resistor as the load. The resistor is typically one micrometer wide and a couple of micrometers long and occupies space in the RAM cell. As the geometry of RAM cells scales down and memory size increases, there is a need for a resistor of high resistance that does not occupy much space.

U.S. Pat. Nos. 4,965,214 to Choi et al and 4,916,507 to Boudou et al describe methods of achieving particular ranges of resistance values for resistors. U.S. Pat. No. 4,722,913 to Miller describes the doping of a layer of polysilicon by ion implantation only above the source/drain regions to make those locations conductive.

SUMMARY OF THE INVENTION

A principal object of the invention is to provide an effective and very manufacturable method to form a polysilicon resistor in the smallest possible space.

In accordance with the object of this invention, a new method of forming a polysilicon resistor is achieved. Polysilicon gate structures and source/drain regions are formed in and on a semiconductor substrate. A passivation layer is formed overlying the gate structures. A contact window is opened to the drain portion of the source/drain region. A resistor is formed within the contact window as follows. A nitride layer is deposited over the passivation layer and within the contact window. The nitride layer is etched back to form nitride sidewalls within the contact window. A layer of polysilicon is deposited over the passivation layer and within the contact window. The polysilicon layer is etched back to leave the polysilicon only within the contact opening completing formation of the resistor. A second contact window is opened to the source portion of the source/drain region. A barrier metal layer is deposited over the passivation layer, over the resistor, and within the second contact window. A metal layer is deposited over the barrier metal layer and the metal interconnection of the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
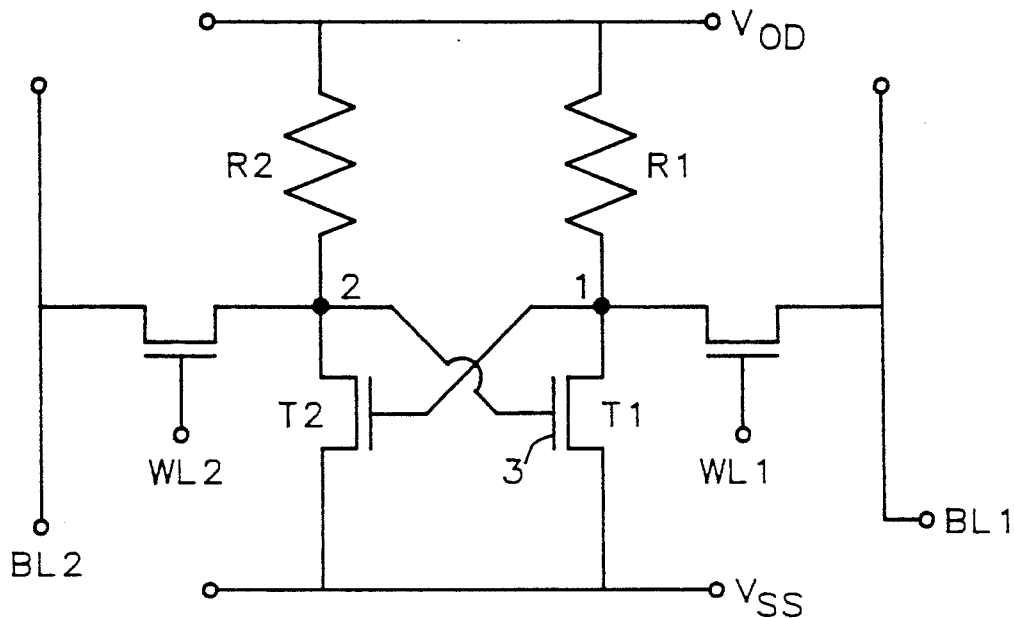
FIG. 1 illustrates the cell structure of a SRAM.

Referring now more particularly to FIG. 1, there is shown the cell structure of a static random access memory (SRAM). The two resistors R1 and R2 and two MOS transistors T1 and T2 in series are coupled between source supply voltage $V_{OD}$ and ground potential $V_{SS}$. Nodes 1 and 2 between the resistors R1 and R2 and MOS transistors T1 and T2, respectively, are coupled to gates of the transistors T1 and T2 in a cross-connection. Between the node points 1 and 2 and bit lines BL1 and BL2, respectively, are connected word lines WL1 and WL2.

Figure 2:
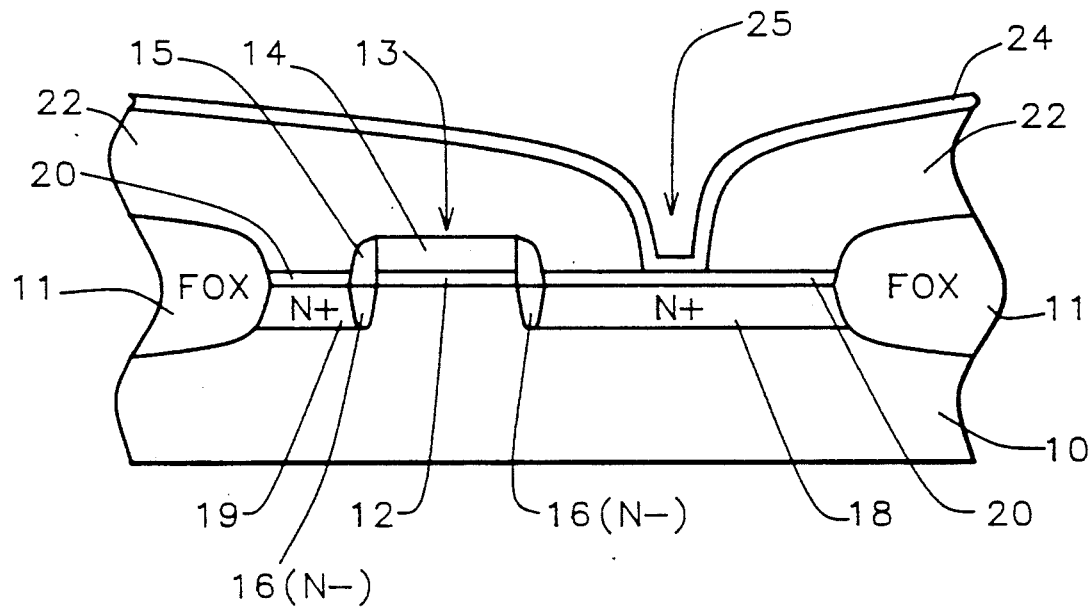
FIGS. 2, 3A, 3B, 4, and 5 schematically illustrate in cross-sectional representation preferred embodiments of the method for forming a vertical resistor which can be used in a high density SRAM.

Referring now to FIGS. 2 through 5, there is shown in cross-sectional representation, the sequence of steps of the preferred embodiments of the present invention. Referring to FIG. 2, there is shown a partially completed SRAM integrated circuit. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 11. Then semiconductor devices can be provided in the silicon mesas according to the following processes.

The surface of the silicon substrate 10 is thermally oxidized to form the desired gate oxide 12 thickness. The preferred thickness is between about 150 to 400 Angstroms. The polysilicon layer 14 is blanket deposited by LPCVD (Low Pressure Chemical Vapor Deposition) method to a conventional thickness. The polysilicon layer 14 is ion implanted with phosphorous or arsenic ions by conventional methods and dosages to render the polysilicon layer conductive. The layers 12 and 14 are patterned by conventional lithography and anisotropic etching techniques as are conventional in the art to provide a desired pattern of gate electrodes such as gate 13 as seen in FIG. 2. Sidewalls 15 also are formed as is conventional in the art.

The source/drain structure of the integrated circuit may be formed by conventional methods. The lightly doped drain (LDD) N− regions are ion implanted. The typical dopant concentration for the regions 16 is 3E12. The LDD source/drain regions are completed by the ion implantation of N+ ions to form the heavily doped regions 18 and 19. The preferred dopant concentration for these regions is 5E15.

A refractory metal layer is now formed over the source/drain regions 18 and 19. This layer 20 may be composed of $TiSi_2$ or $CoSi_2$. The layer 20 is deposited by sputtering the metal followed by silicidation using rapid thermal annealing. The preferred thickness of the refractory metal layer 20 is between about 400 to 1000 Angstroms. Unreacted material is removed from the oxide substrate by an ammonium peroxide solution. The purpose of the refractory metal layer is to lower source/drain resistance as well as reducing dopant diffusion into the resistor to be formed on top of this layer 20.

A passivation or insulating layer 22 is now formed over the surfaces of the patterns. This layer may be composed of borophosphosilicate glass (BPSG) or phosphosilicate glass (PSG). The operational thickness of this layer is between about 4000 to 8000 Angstroms. This layer typically is deposited by atmospheric CVD or LPCVD.

A contact window 25 is formed through the insulating structure to the drain portion 18 of the source/drain regions. Conventional lithography and etching techniques are used to form this opening. The resistor will be fabricated within this contact window 25. Referring to FIG. 1, transistor T1 corresponds to gate electrode 13 in FIG. 2 and resistor R1 will be formed within contact window 25 in FIG. 2.

A silicon nitride layer 24 is deposited over the passivation layer 22 and within the contact window 25. This layer may be composed of $Si_3N_4$ and is deposited by LPCVD to a preferred thickness of between about 500 to 2000 Angstroms. A minimum thickness of 500 Angstroms is required to block out any outdiffusion from the borophosphosilicate glass into the resistor. The remaining thickness up to 2000 Angstroms is used to narrow the resistor itself by narrowing the contact opening.

Figure 3A:
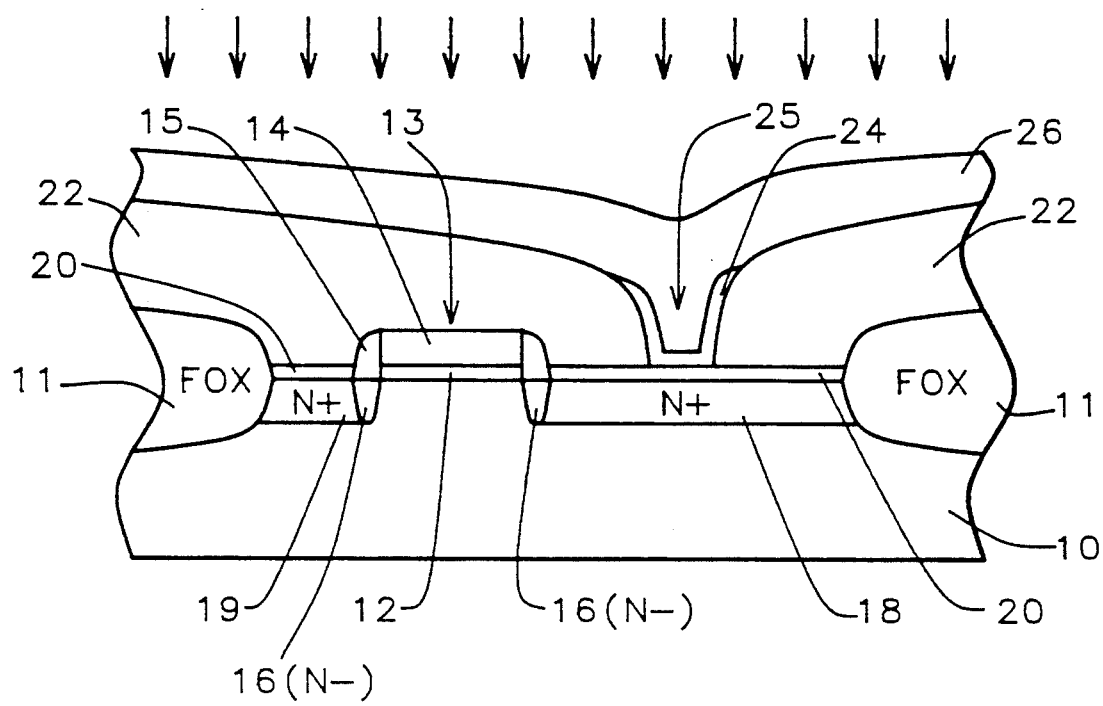
Figure 3B:
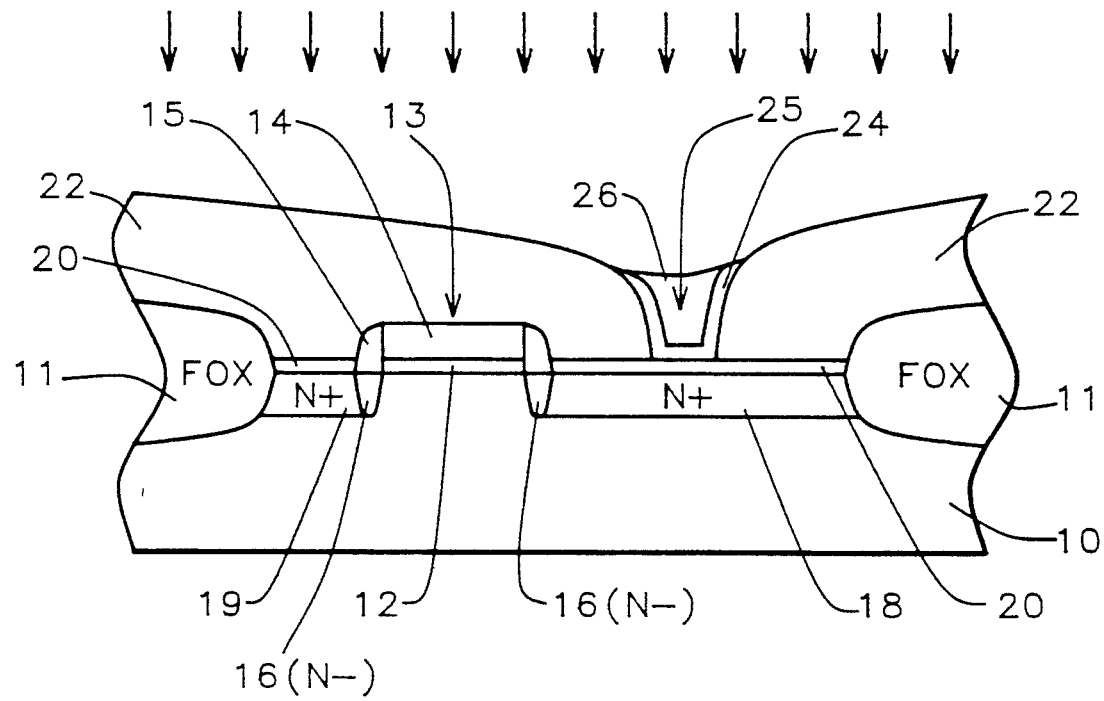

The silicon nitride layer 24 is anisotropically etched back using $SF_6$ gas to form nitride sidewalls within contact window 25, as shown in FIGS. 3A and 3B. A layer of intrinsic polysilicon 26 is deposited by LPCVD using silane to a thickness of between about 5000 to 7000 Angstroms over the passivation layer 20 and within contact window 25.

Boron or other conductivity imparting ions may now be implanted into the intrinsic polysilicon layer 26 to define its desired resistance in the vertical resistor as shown in FIG. 3A. Or, preferably, ion implantation can be done after the polysilicon layer 26 is etched back as shown in FIG. 3B. The polysilicon layer 26 is etched back in a parallel plate reactor with RF plasma of $Cl_2$ gas present. The endpoint of the anisotropic $Cl_2$ etch presents no problem of microloading overetch into the vertical resistor because the dimension at the surface of the vertical resistor is so small in relation to the surface of the horizontal etchstop surface. All the polysilicon above the vertical resistor region is removed.

Preferably boron ions are implanted lightly into the polysilicon layer 25 with a preferred dosage of 5E12 to 5E13 ions/$cm^2$ and energy of 80 to 150 KEV. This will produce a resistance of 1 to 100 Gigaohms. The ions can be implanted before or after polysilicon etchback as shown in FIGS. 3A and 3B, respectively. The ions implanted into layer 22 have no effect upon the devices in and on the integrated circuit.

Figure 4:
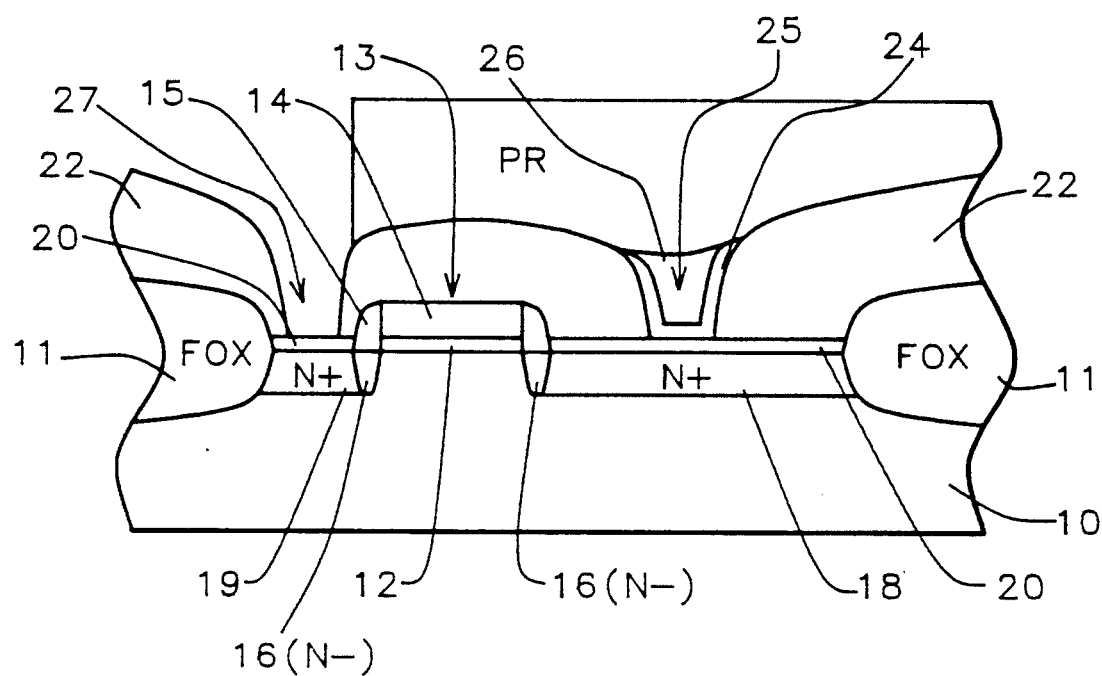

Referring to FIG. 4, there is shown the resistor within contact opening 25 connected to the drain 18. Photoresist layer 28 is applied over the transistor 13 and resistor 25 regions. Another contact window 27 is opened to the source portion 19 of the source/drain region by exposing and developing the area not covered by photoresist layer 28 and etching the BPSG or PSG layer 22 to expose the source/drain or polysilicon region to be contacted by metal $V_{OD}$ line or $V_{SS}$ line or metal jumpers connecting polysilicon gate of T2 to the drain of T1, as illustrated in FIG. 1.

The wafer is then subjected to a high temperature operation at between about 850° to 1000° C. by furnace or RTA to bevel or flow the contact window as well as to activate the dopant in the vertical polysilicon resistor.

Figure 5:
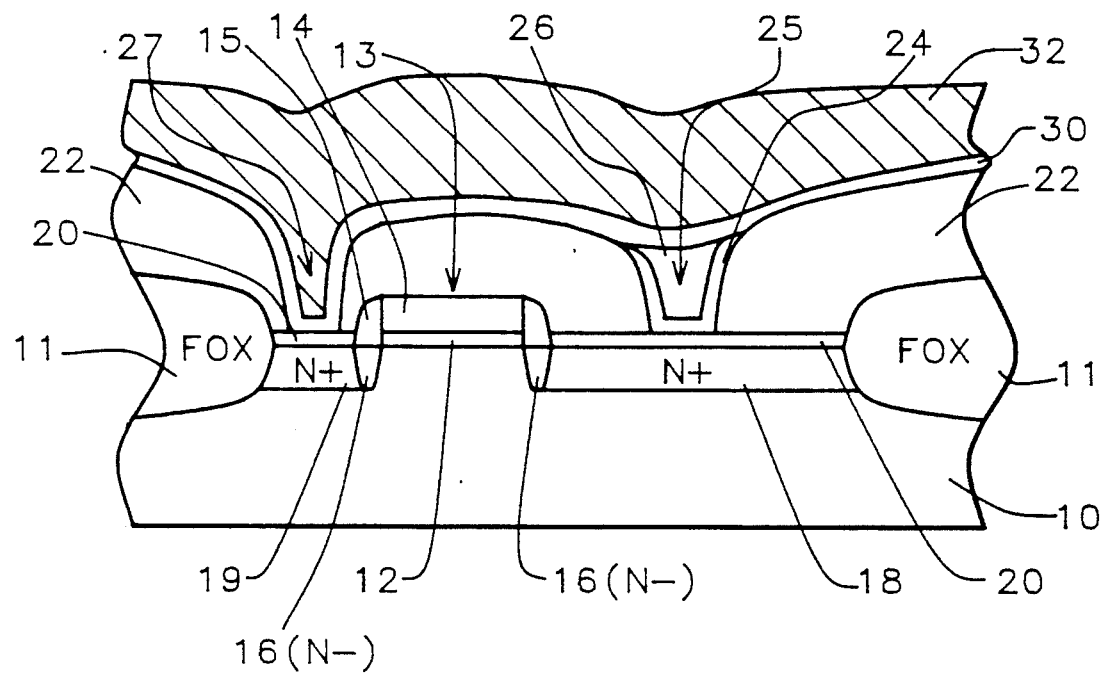

Referring to FIG. 5, there is shown barrier metal layer 30, for example, TiN or TiW. This layer is deposited by sputtering for TiW or reactive sputtering for TiN over passivation layer 22, resistor layer 26, and within contact opening 27 to a thickness of between about 400 to 1200 Angstroms. Metal layer 32, composed of Al-Cu or Al-Si-Cu is deposited by sputtering over barrier metal layer 30 to a thickness of between about 4500 to 10,000 Angstroms. Processing continues as is conventional in the art to complete formation of the metal interconnect of the SRAM integrated circuit by making contact to the vertical resistor 26 and source/drain region 19.

Referring to FIG. 5, Length L is 0.5 to 0.8 micrometers and window width W is between 0.5 and 0.8 micrometers. The resistance $$R = P \times \frac{Length}{Area}$$

where P is the resistivity of the polysilicon resistor and Area is the cross section of the resistor which is $$pi \times \left( \frac{W}{2} - T\,nitride \right)^2$$

Notice that the window width W has been reduced by the thickness of the nitride (T nitride = the thickness of the nitride layer) within the window.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit having a vertical resistor directly connected to a drain region comprising:

providing polysilicon gate structures and source/drain regions in and on a semiconductor substrate;

forming a refractory metal silicide layer over said source/drain regions;

forming a passivation layer overlying said gate structures;

opening a contact window through said passivation layer to the drain portion of said source/drain region;

forming a resistor within said contact window comprising:

depositing a silicon nitride layer over said passivation layer and within said contact window;

anisotropically etching back said nitride layer to form nitride sidewalls within said contact window to prevent migration of any impurities from said passivation layer into said planned vertical resistor;

depositing a layer of polysilicon over said passivation layer and within said contact window;

anisotropically etching back said polysilicon to leave said polysilicon only within said contact opening; and ion implanting said polysilicon layer within said contact window with sufficient ions to provide said resistor and completing formation of said resistor and simultaneously ion implanting impurities into said passivation layer;

opening second contact window through said passivation layer to source portion of said source/drain region;

depositing barrier metal layer electrically contacting and over said passivation layer, over said resistor, and within said second contact window;

depositing metal layer over said barrier metal layer; and completing metal interconnection of said integrated circuit.

2. The method of claim 1 wherein said refractory metal silicide layer overlying said source/drain regions is composed of $TiSi_2$ and is between about 400 to 1000 Angstroms in thickness.

3. The method of claim 1 wherein said polysilicon layer is deposited by low pressure chemical vapor deposition to a thickness of between about 5000 to 7000 Angstroms.

4. The method of claim 1 wherein said polysilicon layer within said contact opening is ion implanted with boron ions with a dosage of between 5E12 and 5E13 ions/cm$^2$ and energy of between 80 and 150 KEV.

5. The method of claim 1 wherein said barrier metal layer is composed of TiW and has a thickness of between about 400 to 1200 Angstroms.

6. The method of claim 1 wherein said barrier metal layer is composed of TiN and has a thickness of between about 400 to 1200 Angstroms.

7. A method for fabricating an integrated circuit having a vertical resistor directly connected to a drain region comprising:

providing polysilicon gate structures and source/drain regions in and on a semiconductor substrate;

forming a refractory metal silicide layer over said source/drain regions;

forming a passivation layer having dopant impurity material therein overlying said gate structures;

opening a contact window through said passivation layer to the drain portion of said source/drain region;

forming a resistor within said contact window comprising:

depositing a silicon nitride layer over said passivation layer and within said contact window;

anisotropically etching back said nitride layer to form nitride sidewalls within said contact window to prevent migration of any impurities from said passivation layer into said planned vertical resistor;

depositing a layer of polysilicon over said passivation layer and within said contact window;

ion implanting said polysilicon layer with sufficient ions to provide said resistor within said contact window; and anisotropically etching back said polysilicon to leave said polysilicon only within said contact opening completing formation of said resistor;

opening second contact window through said passivation layer to source portion of said source/drain region;

depositing barrier metal layer electrically contacting and over said passivation layer, over said resistor, and within said second contact window;

depositing metal layer over said barrier metal layer; and completing metal interconnection of said integrated circuit.

8. The method of claim 7 wherein said refractory metal silicide layer overlying said source/drain regions is composed of $TiSi_2$ and is between about 400 to 1000 Angstroms in thickness.

9. The method of claim 7 wherein said polysilicon layer is deposited by low pressure chemical vapor deposition to a thickness of between about 5000 to 7000 Angstroms.

10. The method of claim 7 wherein said polysilicon layer is ion implanted with boron ions with a dosage of between 5E12 and 5E13 ions/cm$^2$ and energy of between 80 and 150 KEV.

11. The method of claim 7 wherein said barrier metal layer is composed of TiW and has a thickness of between about 400 to 1200 Angstroms.

12. The method of claim 7 wherein said barrier metal layer is composed of TiN and has a thickness of between about 400 to 1200 Angstroms.

13. The method of forming a vertical resistor within a contact window of an integrated circuit comprising:

providing a contact window through a passivation layer to a device structure within a semiconductor substrate;

depositing a silicon nitride layer within said contact window;

anisotropically etching back said nitride layer to form nitride sidewalls within said contact window to prevent migration of any impurities from said passivation layer into said planned vertical resistor;

depositing a layer of polysilicon within said contact window;

anisotropically etching back said polysilicon to leave said polysilicon only within said contact opening; and ion implanting into said polysilicon layer remaining in said contact window sufficient ions and simultaneously into said passivation layer to provide for said planned vertical resistor thereby completing formation of said resistor.

14. The method of claim 13 wherein said device structure is a source/drain region.

15. The method of claim 13 wherein said device structure is a conducting polysilicon layer.

16. The method of claim 13 wherein said polysilicon layer is deposited by low pressure chemical vapor deposition to a thickness of between about 5000 to 7000 Angstroms.

17. The method of claim 13, wherein said polysilicon layer remaining in said contact opening is ion implanted with boron ions with a dosage of between 5E12 and 5E13 ions/cm$^2$ and energy of between 80 and 150 KEV.

18. The method of claim 7 wherein said dopant impurity material in said passivation layer includes phosphorus.

* * * * *